US006039802A

United States Patent [19]
Sekijima et al.

[11] Patent Number: 6,039,802
[45] Date of Patent: Mar. 21, 2000

[54] SINGLE CRYSTAL GROWTH METHOD

[75] Inventors: Takenori Sekijima, Shiga-ken; Takashi Fujii, Otsu; Kikuo Wakino, Muko; Masakatsu Okada, Kyoto, all of Japan

[73] Assignee: Murata Manufacturing Co., Ltd., Japan

[21] Appl. No.: 09/035,472

[22] Filed: Mar. 5, 1998

[30] Foreign Application Priority Data

Mar. 12, 1997 [JP] Japan .................................. 9-078977

[51] Int. Cl.⁷ .................................................. C30B 13/02
[52] U.S. Cl. ........................... 117/49; 117/43; 117/44; 117/50; 117/51
[58] Field of Search ........................ 117/1, 2, 43, 44, 117/47, 49, 50, 51, 904, 922

[56] References Cited

U.S. PATENT DOCUMENTS

| | | | |
|---|---|---|---|
| 3,086,856 | 4/1963 | Siebertz | 117/44 |
| 4,218,282 | 8/1980 | Kochi | 117/50 |
| 4,532,000 | 7/1985 | Harrington et al. | 117/13 |
| 4,654,065 | 3/1987 | Naumann et al. | 65/422 |
| 5,444,040 | 8/1995 | Kojima et al. | 505/238 |
| 5,476,063 | 12/1995 | Nakatani et al. | 117/11 |
| 5,891,828 | 4/1999 | Oka et al. | 505/451 |

OTHER PUBLICATIONS

Collection of Manuscripts of Lecture, the 42nd Spring Lecture Meeting of the Association Related to Applied Physics, No. 1, 28p–TA–16, 1995; p. 221.

The 27th Domestic Conference on Crystal Growth, Sekijima, et al.; 801a1B3, 1996; vol. 23, No. 3, 1996; p. 263.

Journal of Crystal Growth 41 (1977); North–Holland Publishing Company; Single Crystal Growth of Yig by the Floating Zone Method; S. Kimura and I. Shindo; pp. 192–198.

*Primary Examiner*—Felisa Hiteshew
*Attorney, Agent, or Firm*—Ostrolenk, Faber, Gerb & Soffen, LLP

[57] ABSTRACT

There is provided a single crystal growth method which allows single crystal of an incongruent melting compound to be grown stable while controlling its growth orientation. The single crystal growth method comprises the steps of: holding polycrystal and seed crystal within a heating furnace; joining the polycrystal with the seed crystal; heating the polycrystal on the side opposite from the side where the polycrystal is joined with the seed crystal to form a melt zone; moving the melt zone to the side where the polycrystal is joined with the seed crystal so that the melt zone is in contact with the seed crystal to allow seeding; and growing single crystal by moving the melt zone which has been in contact with the seed crystal and been seeded to the opposite side from the side where the polycrystal is joined with the seed crystal.

20 Claims, 4 Drawing Sheets

SINGLE CRYSTAL GROWTH METHOD

BACKGROUND OF THE INVENTION

1. Field of the Invention

The present invention relates to a single crystal growth method, and more particularly to a method for growing single crystals for use in an optical isolator, high temperature superconducting cable and the like.

2. Description of the Related Art

Magnetic garnet single crystals containing iron, exemplified by yttrium—iron—garnet single crystal ($Y_3Fe_5O_{12}$: hereinafter abbreviated as "YIG"), having a large Faraday effect have been used as a material for optical isolators.

Further, oxide superconductors, exemplified by yttrium-barium-copper oxide ($YBa_2Cu_3O_x$: hereinafter abbreviated as "YBCO"), for which low cost liquid nitrogen may be used as a coolant have been typically used as a material for superconducting cables.

These compounds are known as incongruent melting compounds and single crystals cannot be obtained directly from a raw material having a congruent melting composition. Therefore, method for growing single crystal by using a flux having a special composition has generally been employed.

More specifically, as shown in FIG. 1, YIG is a incongruent melting compound and is decomposed at about 1585° C. when its temperature is increased. However, YIG cannot be obtained even if a melt having a stoichiometric composition is coagulated and is decomposed into ortho-ferrite ($YFeO_3$) and liquid phase. Therefore, a method for growing YIG single crystal by means of a flux method or an LPE (liquid phase epitaxy) method has been adopted in which a solvent is prepared in which lead oxide (PbO) and diboron trioxide ($B_2O_3$) are mixed within a crucible made of Pt and by using a solution in which diiron trioxide ($Fe_2O_3$) and diyttrium trioxide ($Y_2O_3$) are dissolved as solutes. The flux method allows bulk single crystals to be obtained by putting seed crystals in the above-mentioned solution and by slowly cooling it. The LPE method allows a thin film single crystal to be obtained by growing crystals on a gadolinium—gallium—garnet ($Gd_3Ga_5O_{12}$: hereinafter abbreviated as "GGG") single crystal substrate.

Further, there is known a floating zone melting method (hereinafter referred to as a FZ method) for growing single crystals. The FZ method involves growing single crystals by maintaining a polycrystal raw material within a heating furnace, creating a melt zone by heating only a certain portion to a temperature higher than the melting point and moving the melt zone. The FZ method has merits that it allows one to avoid impurities from being introduced from a crucible member because it uses no crucible, that the atmosphere can be arbitrarily set and that it allows single crystals of a high melting point substance to be fabricated.

There has been also known a traveling solvent floating zone method (hereinafter abbreviated as a TSFZ method) as one species of the FZ method. The TSFZ method of growing single crystal involves providing a seed crystal solvent whose composition and weight have been precisely controlled, heating and fusing to be fully congruent and then by combining with a polycrystal as a raw material (S. Kimura et.al., J. Cryst. Growth, 41 (1977)192–198). Because this method allows bulk single crystals of the incongruent melting compound to be grown from a melt, single crystals of oxide high temperature superconductor are now actively grown by using the TSFZ method.

The inventors have grown fibrous YIG single crystal by the FZ method by using a YAG laser heating image furnace mounting a YAG laser as an optical heating unit (Collection of Manuscripts of Lecture, the 42nd Spring Lecture Meeting of Association Related to Applied Physics, No. 1, 28p-TA-16, 1995).

As a result of intensive research, the inventors have found that YIG grows directly from the surface of the seed crystal without using solvent intentionally when the specimen is fiberized. Studying this mechanism of growth, the inventors have found that it is a self-adjusting reaction in that $YFeO_3$ (ortho-ferrite), the initial phase, grows at the melt zone part right under the joint between the polycrystal raw material and the seed crystal and that YIG deposits as the remaining liquid phase rich in Fe becomes a fusing agent (Sekijima, et. al.: The 27th Domestic Conference On Crystal Growth, 801a1B3, 1996).

It is noted that the single crystal growth apparatus which the inventors have used is designed so as to be able to create a very small melt zone as compared to a normal optical heating unit in order to deal with the fibrous and thin specimen. Therefore, the above-mentioned self-adjusting reaction occurs instantaneously at the very small area.

Because ortho-ferrite deposits as the initial phase at the joint between the raw material and the seed crystal in the conventional FZ method, the growth orientation of the single crystal could not be controlled. As a result, the single crystal had to be grown by the TSFZ method to control the growth orientation of the single crystal. However, it is physically difficult to position solvent on the seed crystal in obtaining thin crystal whose diameter is less than 3 mm. Still further, because the amount of solvent is very small, it is also difficult to control its weight. For these reasons, there has been a problem that when the amount of solvent is inadequate, the shape of the obtained single crystal becomes unstable because the composition fluctuates during growing the single crystal.

There has been also the trouble in the TSFZ method that the shape of the melt zone becomes unstable and the melt zone is cut off from growing the single crystal as the melt within the melt zone infiltrates into the polycrystal raw material.

For the forgoing reasons, there is a need for a single crystal growth method which allows the single crystal of the incongruent melting compound to be stably grown while controlling the growth orientation.

SUMMARY OF THE INVENTION

The present invention is directed to a single crystal growth method that satisfied this need. The single crystal growth method comprises the steps of: holding a joined polycrystal and seed crystal within a heating furnace; heating the polycrystal on the opposite side from the side where the polycrystal is joined with the seed crystal to form a melt zone; moving the melt zone to the side where the polycrystal is joined with the seed crystal so that the melt zone is in contact with the seed crystal; and growing the single crystal by moving the melt zone which has been in contact with the seed crystal and been seeded to the opposite side from the side where the polycrystal is joined with the seed crystal.

According to the present invention, the single crystal of the incongruent melting compound may be grown without using a separate solvent. Since the density of the raw material may be increased, good quality crystal can be grown with a high yield. Further, the single crystal growth method of the present invention allows a single crystal having size which conforms to the shape of a device to be mass-produced.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
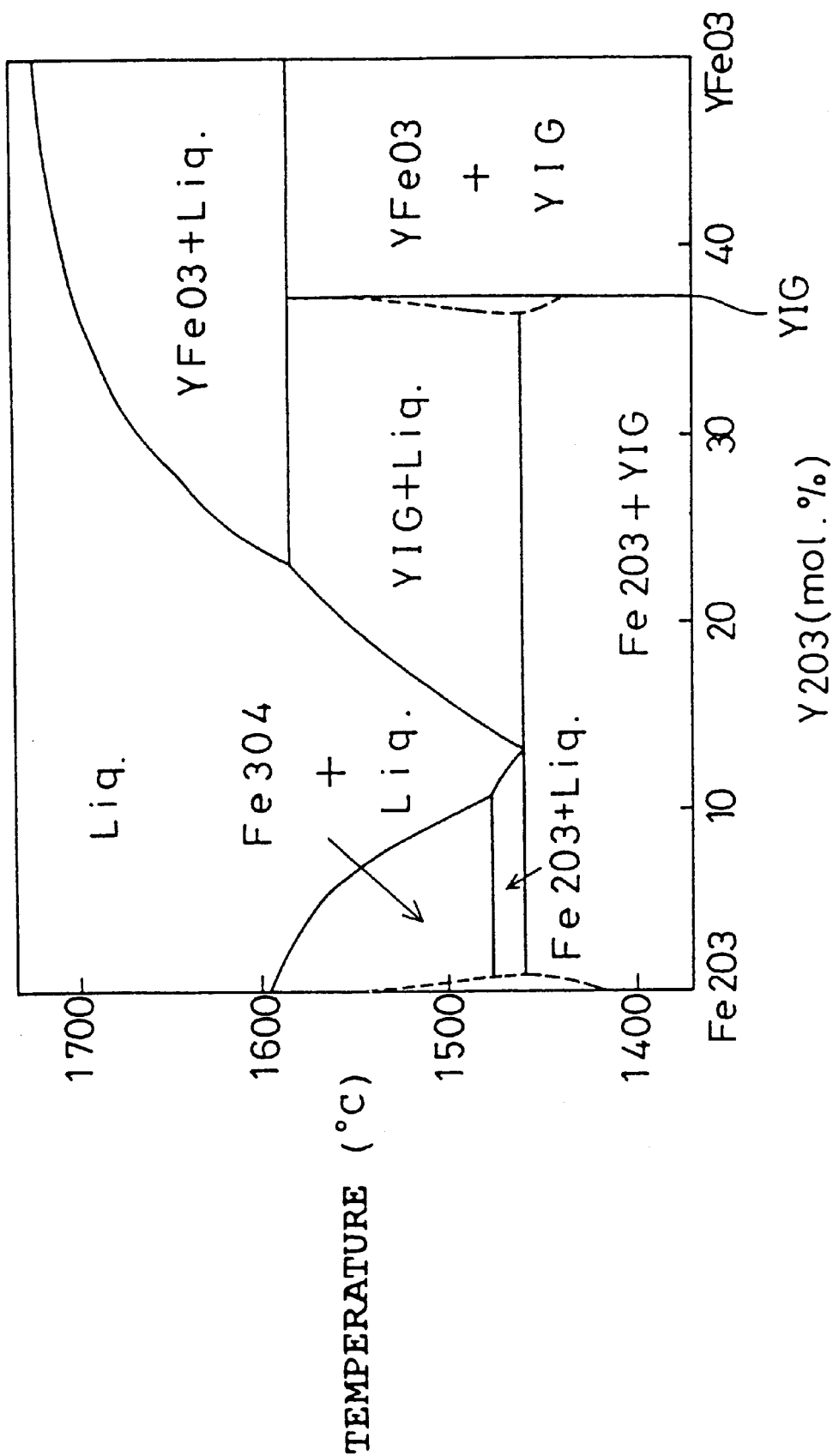
FIG. 1 is a binary phase diagram of $Fe_2O_3$—$YFe_2O_3$ system under one atmosphere oxygen pressure.

The single crystal growth method of the present invention is a method for growing single crystal by putting $YFeO_3$ generated at a joint part of a polycrystal raw material and a seed crystal out of the reaction system and by using the produced liquid phase as solvent. In other words, the present invention is a single crystal growth method using the self-adjusting solvent (liquid phase) produced by the incongruent melting reaction. The single crystal growth method of the invention is therefore referred as a Self Solvent Floating Zone (SSFZ) Method.

According to the single crystal growth method of the present invention, polycrystal and seed crystal of magnetic garnet single crystal, such as YIG or oxide superconductor such as YBCO, are first held in a heating furnace with heating device and joined to each other. Then, on the opposite side from the side from where the polycrystal is joined with the seed crystal, the polycrystal is heated to form a melt zone. Thereafter, the melt zone is moved to the side where the polycrystal is joined with the seed crystal by shifting the heating zone. When the melt zone reaches the joint portion, the melt zone is seeded by allowing the melt zone to contact the seed crystal for a while. After that, the single crystal is grown by moving the melt zone which has been in contact with the seed crystal and been seeded toward the opposite side from the side where the polycrystal is joined with the seed crystal.

During the aforementioned process, ortho-ferrite ($YFeO_3$) is put outside of the reaction system by causing an incongruent melting reaction by heating and fusing the polycrystal as the raw material on the opposite side from the side where the polycrystal is joined with the seed crystal and by moving the produced liquid phase to the side of the seed crystal to join with the seed crystal. Therefore, the produced liquid phase has a composition suitable for YIG to be deposited. Accordingly, the single crystal growth method of the present invention allows the growth orientation of the single crystal to be controlled and good quality single crystal to be grown with a high yield.

Further, according to the single crystal growth method of the present invention, the polycrystal as the raw material is heated and fused once, so that the density of the polycrystal as the raw material increases. Therefore, it is possible to suppress the melt from infiltrating into the polycrystal raw material and the shape of the melt zone may be stabilized.

Accordingly, it is possible to prevent the melt zone from being cut off during the growth of the single crystal and the shape of the single crystal thus obtained is also stabilized.

According to the single crystal growth method of the present invention, the polycrystal may have any shape, e.g., fiber, square bar, thin plate or film on a substrate. This allows the single crystal which conforms to the shape of the device to be directly grown.

Further, according to the single crystal growth method of the present invention, the polycrystal may be a thin crystal having a fibrous shape of less than 3 mm in diameter or a square bar or a thin plate of less than 3 mm in width. The polycrystal may also be a film formed on a substrate whose width is less than 3 mm.

The melt zone is preferably formed by an optical heating device so that a sharp temperature gradient is created at the melt zone section and that the growth of ortho-ferrite may be suppressed.

Hereinafter, preferred embodiments of the present invention will be explained in more detail with referring to the drawings. While a single crystal growth method of the present invention can be used in growing magnetic garnet single crystal and oxide high temperature superconductor for example, it will be explained below by exemplifying YIG.

Figure 2A:
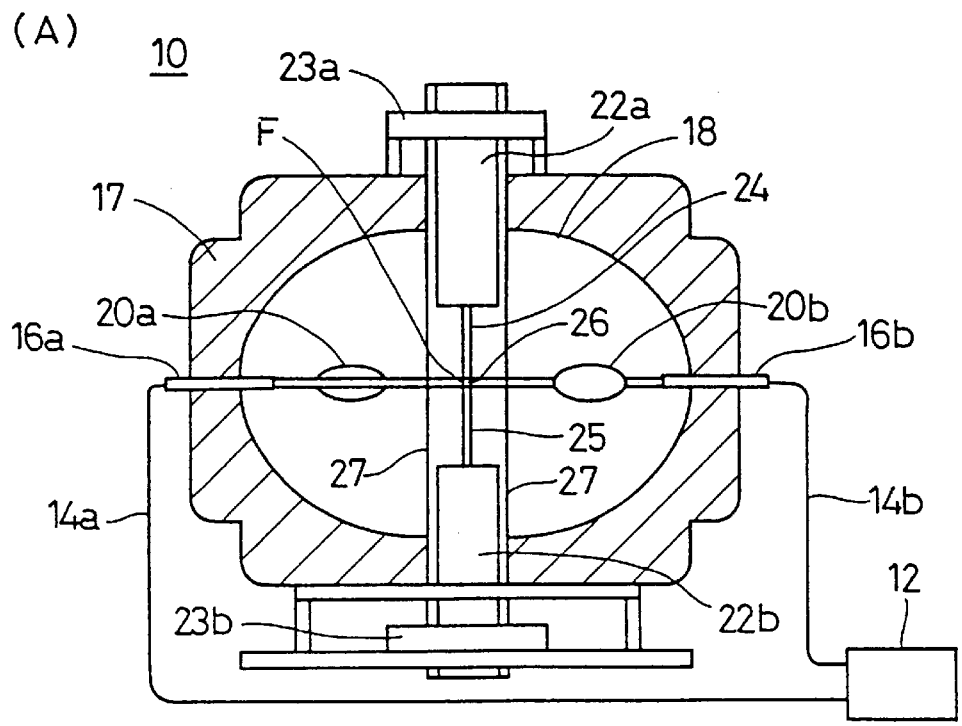
FIG. 2A is a front sectional view showing one example of a single crystal growth apparatus for the single crystal growth method of the present invention.
Figure 2B:
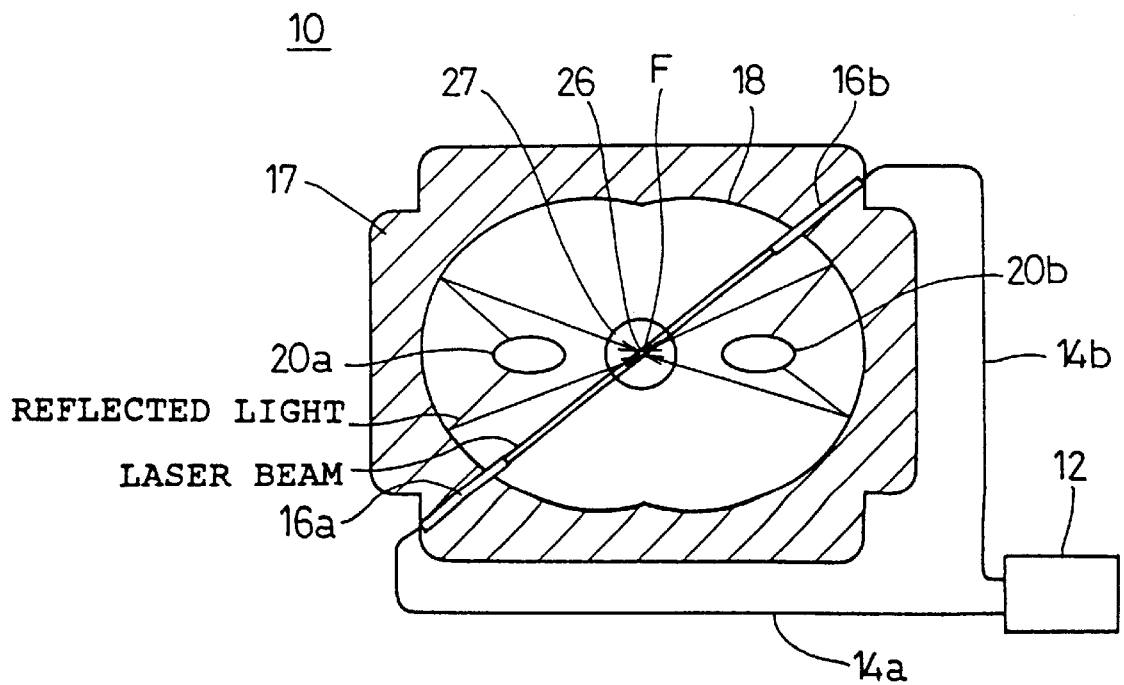
FIG. 2B is a top sectional view of the single crystal growth apparatus shown in FIG. 1A.

FIG. 2A is a front sectional view showing one example of a single crystal growth apparatus for the single crystal growth method of the present invention. FIG. 2B is a top sectional view of the single crystal growth apparatus shown in FIG. 2A.

The single crystal growth apparatus 10 comprises a YAG laser generating unit 12 comprising an optical heating unit as a main heating unit. Two laser beam emitting ports 16a and 16b are formed for the YAG laser generating unit 12 via fibers 14a and 14b.

The single crystal growth apparatus 10 also comprises a case 17. A cubic bi-elliptic mirror 18 surrounded by a rotational face of a bi-ellipse which is turned around its major axis is formed as a reflecting plate within the case 17. Here, the bi-ellipse is a shape in which two ellipses are combined while sharing one focal point. The laser beam emitting ports 16a and 16b penetrate through the case 17 and the bi-elliptic mirror 18 and are disposed so as to face each other interposing the spatial center part surrounded by the bi-elliptic mirror 18.

Halogen lamps 20a and 20b are disposed within the bi-elliptic mirror 18 at the different positions corresponding to focal points of the respective ellipses. The bi-elliptic mirror 18 and the halogen lamps 20a and 20b compose an optical heating unit as an auxiliary heating unit. The halogen lamps 20a and 20b are light sources as heat sources. Lights from the halogen lamps 20a and 20b are reflected by the inner face of the bi-elliptic mirror 18 and are focused at the confocal point F of the bi-ellipse. Further, the laser beams from the laser beam emitting ports 16a and 16b are also emitted toward the confocal point F of the bi-ellipse within the bi-elliptic mirror 18.

Accordingly, a specimen is heated when it is disposed at the confocal point F at the spatial center part surrounded by the bi-elliptic mirror 18. It is also possible to set the temperature distribution and temperature gradient at the optimum conditions by controlling the output of the YAG laser and the output of the halogen lamps 20a and 20b. While the temperature reaches around 1720° C. for example at the confocal point F in the present invention, the temperature drops abruptly at the portion which is distant from the confocal point F as that portion is not heated. Accordingly, a large and abrupt temperature gradient is formed at the heating part and the vicinity thereof. It is also possible to control the temperature gradient in the vicinity of a melt zone 26 described later by controlling the output of the halogen lamps 20a and 20b.

An upper shaft 22a and a lower shaft 22b for holding a raw material bar and a seed crystal are disposed so as to face each other with the confocal point F therebetween at the inside surrounded by the bi-elliptic mirror 18. The upper shaft 22a and the lower shaft 22b extend from the inside to the outside of the bi-elliptic mirror 18, respectively, and are attached to an upper shaft moving unit 23a and a lower shaft moving unit 23b. The upper shaft moving unit 23a and the lower shaft moving unit 23b actuate the upper shaft 22a and the lower shaft 22b in the shaft direction in synchronism with each other. The moving rate is around 10 mm/hr when dissolving/coagulating the raw material bar and is about 1 mm to 8 mm/hr, preferably, when growing single crystal. That is, it is preferable that the moving rate is greater in the dissolving/coagulating step than that in crystal growth step.

In this embodiment, the upper shaft 22a and the lower shaft 22b move at the same moving rate in synchronism with each other. However, the moving rates of the upper shaft 22a and the lower shaft 22b may be made different when growing the single crystal. For instance, a single crystal thinner and narrower than the raw material bar may be obtained when the moving rates of the upper shaft 22a and the lower shaft 22b are set such that the upper shaft 22a is separated gradually from the lower shaft 22b. A single crystal thicker than a raw material bar may be obtained when the moving rates of the upper shaft 22a and the lower shaft 22b are set such that the upper shaft 22a gets closer to the lower shaft 22b. It is noted that although the single crystal growth apparatus 10 causes the raw material bar to be moved while fixing the position where the laser beam and reflected light for heating are focused, it is possible to arrange the apparatus such that the position where the laser beam and the reflected light focused is moved while fixing the raw material bar.

A YIG polycrystal having a shape of round bar, square bar, plate or the like is fixed as the raw material bar 24 at the end of the upper shaft 22a facing to the lower shaft 22b. This YIG polycrystal is a ceramic. When a round bar is used as the raw material bar 24, a fibrous single crystal having a circular section may be obtained. When a square bar is used, fibrous or thin plate single crystal having a rectangular section may be obtained. It is noted that the single crystal having a rectangular section may be obtained more readily by adjusting the spot of the irradiated laser beam into an oblong shape. For instance, when the raw material member is wide, the laser beam may be diffused by a lens to widen the irradiated spot.

The seed crystal 25 is fixed at the end of the lower shaft 22b facing to the upper shaft 22a. By holding the raw material bar 24 and the seed crystal 25 as described above, they both abut each other. YIG single crystal is used as the seed crystal 25. It is noted that the seed crystal 25 may be attached to the upper shaft 22a and the raw material bar 24 may be attached to the lower shaft 22b, contrary to what has been described above.

Further, instead of the raw material bar 24, a film raw material member 24 formed by applying a slurry of YIG polycrystal on the surface of a GGG substrate and by drying the slurry for example may be used. This allows a thin plate or thin film magnetic garnet single crystal to be obtained on the GGG substrate. It is noted that either one of the upper shaft 22a or the lower shaft 22b may be only used to hold and move the raw material bar 24 in this case.

The upper shaft 22a, the lower shaft 22b, the raw material bar 24, the seed crystal 25 and the obtained single crystal 28 are stored within a quartz tube 27. The atmosphere within the quartz tube 27 is controlled by filling Ar gas or $O_2$ gas in accordance with manufacturing conditions of the single crystal.

Figures 3A, 3B, 3C:
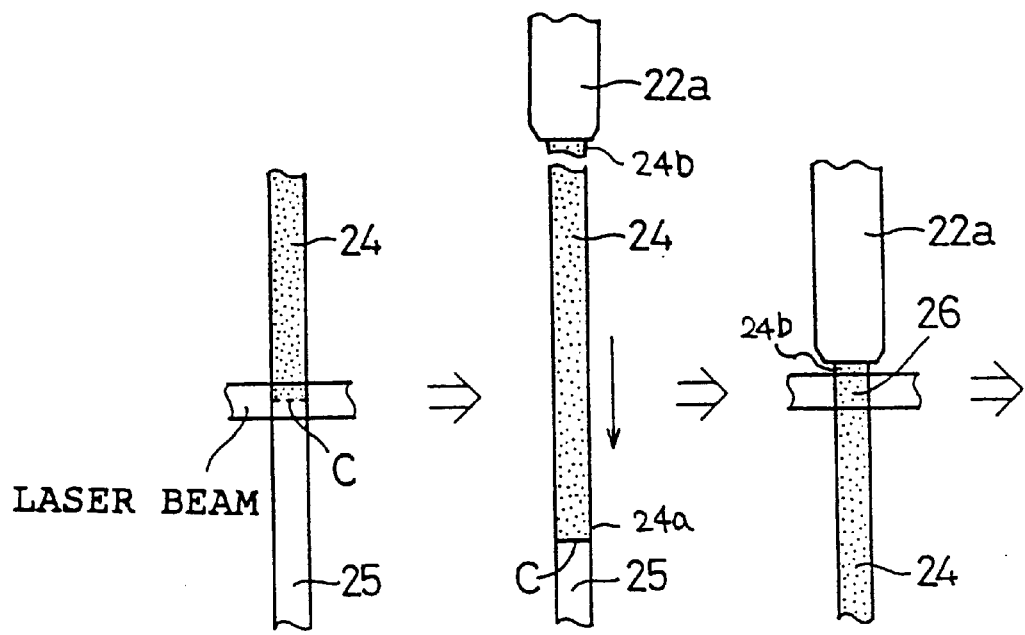
FIGS. 3A to 3F show process steps according to the single crystal growth method of the present invention.

FIGS. 3A to 3F show process steps according to the single crystal growth method of the present invention. The method for growing the YIG single crystal by the single crystal growth apparatus 10 will be explained with reference to these figures. At first (FIG. 3A), the raw material bar 24 is welded to the seed crystal 25. This welding is implemented by disposing the end of the raw material bar 24 facing to the seed crystal 25 at the confocal point F, by heating and melting one end of the raw material bar 24 which is faced with the seed crystal 25 through the main and auxiliary heating units and by abutting the end of the raw material bar 24 to an end of the seed crystal 25. The portion where the raw material bar 24 is welded with the seed crystal 25 will be called a joint C hereinafter. As a result, the polycrystal bar 24 having a first end 24a and a second end 24b and joined to the seed crystal 25 at the first end 24a thereof was obtained (FIG. 3B).

Next, the heating is stopped and the upper shaft 22a and the lower shaft 22b are moved in synchronism with each other to bring the other end (second end 24b) of the raw material bar 24 on the opposite side from the joint C to the confocal point F as shown in FIG. 3B. It is noted that an arrow in FIG. 3B shows the moving direction of the raw material bar 24 and the seed crystal 25. Then, the end (second end 24b) of the raw material bar 24 on the opposite side from the welded section is heated and fused to form a melt zone 26 as shown in FIG. 3C. Therefore, according to this embodiment, ortho-ferrite, the initial phase, is deposited at an end (second end 24b) of the raw material bar 24 on the opposite side from the welded section. Meanwhile, the liquid phase within the melt zone 26 comprises an Fe-rich composition suitable for depositing YIG. Although the shape of the spot of the laser beam and the reflected light caused by the main and auxiliary heating units in this case is an elliptic cube of 1 mm height and 6 mm long, it turns out to be a very small rectangular cubic shape of 1 mm square for example on the raw material bar 24. The temperature of the spot is about 1720° C. Furthermore, since the above-mentioned optical heating units is employed, a sharp temperature gradient is created at the vicinity of the spot.

Figures 3D, 3E, 3F:
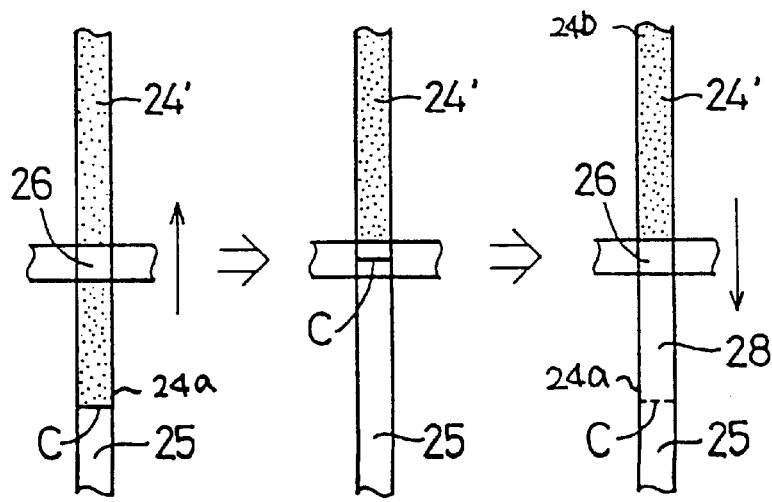

Next, the melt zone 26 is moved toward the joint C (first end 24a) of the raw material bar 24 and the seed crystal 25 by moving the upper shaft 22a and the lower shaft 22b in synchronism as shown in FIG. 3D. It is noted that the arrow in the figure indicates the moving direction of the raw material bar 24 and the seed crystal 25. This lift rate is 10 mm/hr, for example. The portion of the raw material bar 24 in the melt zone 26 is heated and fused. Meanwhile, because a portion 24' of the raw material bar 24 where the melt zone 26 has passed is coagulated after the fusion, the density of the portion 24' has been increased. The moving rate of the melt zone 26 is not limited to the above-mentioned rate and is preferable to be faster as much as possible within the range in which the object of the present invention can be attained. It differs depending on a thickness and the like of the raw material bar 24.

Thus, ortho-ferrite ($YFeO_3$) is put outside of the reaction system and the density of the raw material bar 24 is increased by implementing the steps in FIGS. 3C and 3D.

It is noted that in this embodiment, although the melt zone 26 is formed always at the confocal point F and what are actually moved are the raw material bar 24 and the seed crystal 25, it is regarded as a movement of the melt zone 26 as it can be said that the melt zone 26 is moved relatively.

Next, the melt zone 26 is made to be in contact with the seed crystal 25 as shown in FIG. 3E. In this step, the melt zone 26 is stopped at the joint C (of the first end 24a) for a predetermined time in order to allow full seeding. That is, it is necessary to cause the single crystal material bar 24' of the polycrystal which has been coagulated after fusing once to be congruent fully with the seed crystal 25 to be fully seeded. For example, the melt zone 26 is stopped at the joint C for 30 minutes to one hour.

Next, the single crystal is grown by moving the melt zone 26 from the side of the joint C to the other end (second end 24b) of the raw material bar 24 and by successively implementing heating and melting and cooling and coagulation as shown in FIG. 3F. An arrow in FIG. 3F indicates the moving direction of the raw material bar 24' and the seed crystal 25. The moving rate of the melt zone 26 at this time is 1 mm/hr to 8 mm/hr for example.

Thus, the YIG single crystal 28 is obtained.

First Embodiment

Figure 4:
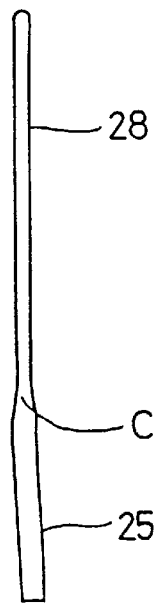
FIG. 4 is a schematic view showing one example of a single crystal fiber manufactured by the single crystal growth method of the present invention, together with seed crystal.

FIG. 4 is a schematic view showing the YIG single crystal 28 of orientation <111> fabricated by the above-mentioned method, together with the seed crystal 25. The size of the single crystal fiber 28 is about 0.8 mm in diameter and about 20 mm long. It has been found that the growth orientation of the single crystal could have been controlled because the Laue image of the YIG single crystal fiber 28 thus obtained is identical to that of the seed crystal 25 when they were compared by taking transmission Laue photographs, respectively.

Second Embodiment

It has been found that the growth orientation of the single crystal could have been controlled because the same Laue images were obtained when the single crystal was grown by using a 3 mm seed crystal 25 in diameter and the raw material bar 24 in the same manner with the first embodiment and Laue photographs of the seed crystal 25 and the single crystal 28 thus grown were taken.

Third Embodiment

It has been found that the growth orientation could not have been controlled because the same Laue images were not obtained when the single crystal was grown by using a 3.5 mm seed crystal 25 in diameter and the raw material bar 24 in the same manner with the first embodiment and Laue photographs of the seed crystal 25 and the single crystal 28 thus grown were taken. When the structure of the joint C of the seed crystal 25 with the single crystal 28 thus obtained was analyzed, ortho-ferrite ($YFeO_3$) was confirmed to exist.

Fourth Embodiment

When the single crystal was grown by using a seed crystal 25 other than that of orientation <111> in the same manner with the first embodiment and Laue photographs of the seed crystal 25 and the single crystal 28 thus obtained were taken, the same Laue images were obtained. Thereby, it has been found that the orientation could have been controlled for those other than that of the orientation <111>.

Fifth Embodiment

The single crystal 28 was grown in the same manner with the fourth embodiment except that a seed crystal 25 of 1 mm in diameter and the raw material bar 24 of 3 mm in diameter were employed and that the moving rate of the upper shaft 22a was made slower than that of the lower shaft 22b so that the distance between the upper shaft 22a and the lower shaft 22b became greater gradually. The same Laue images were obtained when Laue photograph of the seed crystal 25 and the single crystal 28 thus grown were taken, so that it has been found, thereby, that the orientation could have been controlled even when the seed crystal and the raw material whose diameters are different are used.

Sixth Embodiment

It has been found that the orientation could have been controlled in the same manner when YBCO single crystal, i.e. the high temperature superconducting substance, was grown by using a seed crystal 25 of YBCO, an oxide high temperature superconductor, instead of YIG and a raw material bar 24 in the same manner with the first embodiment. It is thought in this case that an insulator $Y_2BCO_5$ which hampers the control of orientation is put outside of the reaction system by the same mechanism as that explained in the above-mentioned embodiment.

Seventh Embodiment

Figure 5:
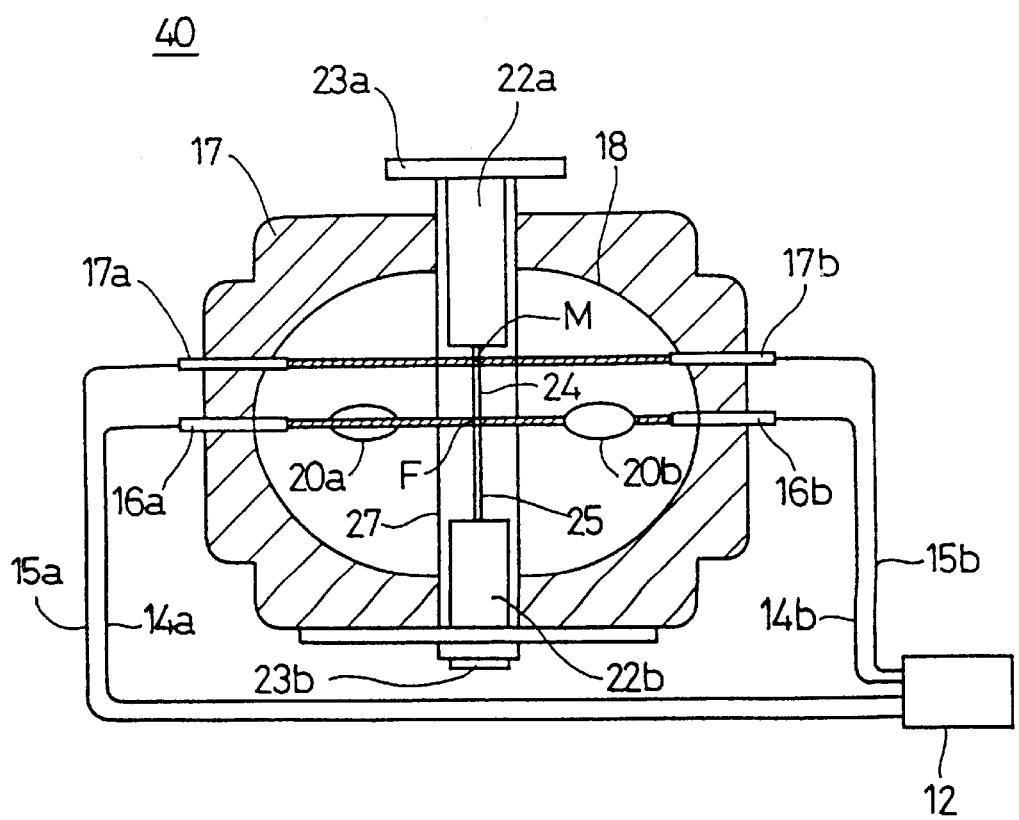
FIG. 5 is a front sectional view showing another example of the single crystal growth apparatus for embodying the single crystal growth method of the present invention.

Single crystal was grown by using a single crystal growth apparatus 40 shown in FIG. 5 in this embodiment.

The single crystal growth apparatus 40 shown in FIG. 5 is different from the single crystal growth apparatus 10 shown in FIG. 2 in that laser beam emitting ports 17a and 17b are provided additionally. The laser beam emitting ports 17a and 17b are connected to the YAG laser generating unit 12 via fibers 15a and 15b. The laser beam emitting ports 17a and 17b are arranged such that the laser beams emitted from the laser beam emitting ports 17a and 17b are irradiated to the raw material bar 24 at point M which is distant from the confocal point F by a predetermined distance. Therefore, the raw material bar 24 is heated and fused also at the point M and a second melt zone 26' is formed. The melt zone 26' is used to put ortho-ferrite outside of the reaction system and to shorten the processing step of increasing the density of the raw material bar 24. That is, the single crystal growth apparatus 40 shown in FIG. 5 allows the moving distance and moving time of the raw material bar 24 to be shortened by forming the melt zone 26 and the melt zone 26' at the same time in steps in FIGS. 3C and 3D and by moving the raw material bar 24 while fusing and coagulating the two locations in the same time.

A single crystal was grown by using the same material bar 24 and the seed crystal 25 with those in the first embodiment by using the single crystal growth apparatus 40 shown in FIG. 5. Then, Laue photographs of the seed crystal 25 and the single crystal 28 thus obtained were taken. It was confirmed that the orientation could have been controlled because the same images were obtained when their Laue images were compared.

As is apparent from the aforementioned explanation, the single crystal growth method of the present invention allows single crystal of the congruent melting compound to be grown without using flux. Further, the single crystal growth method of the present invention allows good. quality crystal to be readily fabricated with a high yield as the method includes the step of increasing the density of the material bar before the step of growing the single crystal. Still more, the single crystal growth method of the present invention allows single crystal having a size conforming to a shape of a device to be mass-produced.

While preferred embodiments of the invention have been disclosed, various modes of carrying out the principles disclosed herein are contemplated as being within the scope of the invention.

What is claimed is:

1. A single crystal growth method comprising the steps of:
   providing an incongruent melting polycrystal having a first and a second end, and a single crystal seed crystal joined to the first end thereof;
   heating a portion of the polycrystal distant from the first end so as to form a melt zone at that portion of the polycrystal;
   moving the melt zone toward the first end of the polycrystal so as to contact the seed crystal; and
   growing single crystal by moving the melt zone toward the second end of the polycrystal.

2. The single crystal growth method according to claim 1, wherein the polycrystal is a fiber, square bar, thin plate or film on a substrate.

3. The single crystal growth method according to claim 2, wherein the polycrystal has a fibrous shape of less than 3 mm in diameter.

4. The single crystal growth method according to claim 2, wherein the polycrystal is a square bar or plate of less than 3 mm in width.

5. The single crystal growth method according to claim 2, wherein the polycrystal is a film on a substrate whose width is less than 3 mm.

6. The single crystal growth method according to claim 1 wherein the melt zone is formed heat from an optical heating unit.

7. The single crystal growth method according to claim 6, wherein the melt zone is moved by shifting the relative positions of the polycrystal and heating unit.

8. The single crystal growth method according to claim 7, wherein the melt zone is maintained in contact with the seed crystal for a time sufficient for the melt zone to become seeded.

9. The single crystal growth method according to claim 8, wherein the growing step is performed by shifting the first end of the polycrystal relative to the heating unit faster than the shifting of the second end relative to said heating unit.

10. The single crystal growth method according to claim 8, wherein the growing step is performed by shifting the first end of the polycrystal relative to the heating unit slower than shifting of the second end relative to the heating unit.

11. The single crystal growth method according to claim 7, wherein the rate of said moving the melt zone toward the first end of the polycrystal is greater than the rate of said moving the melt zone toward the second end of the polycrystal.

12. The single crystal growth method according to claim 11, wherein the rate of said moving the melt zone toward the first end of the polycrystal is about 10 mm/hour and the rate of said moving the melt zone toward the second end of the polycrystal is about 1 to 8 mm/hour.

13. The single crystal growth method according to claim 11, wherein the polycrystal is a magnetic yttrium—iron—garnet polycrystal.

14. The single crystal growth method according to claim 11, wherein the polycrystal is a high temperature yttrium—barium—copper oxide superconductor.

15. The single crystal growth method according to claim 1, wherein the rate of said moving the melt zone toward the first end of the polycrystal is greater than the rate of said moving the melt zone toward the second end of the polycrystal.

16. The single crystal growth method according to claim 1, wherein the melt zone is maintained in contact with the seed crystal for a time sufficient for the melt zone to become seeded.

17. The single crystal growth method according to claim 1, wherein the polycrystal is magnetic garnet polycrystal containing iron.

18. The single crystal growth method according to claim 17, wherein the magnetic garnet single crystal is yttrium—iron—garnet polycrystal.

19. The single crystal growth method according to claim 1, wherein the polycrystal is a high temperature superconductor.

20. The single crystal growth method according to claim 19, wherein the high temperature superconductor is yttrium—barium—copper oxide.

* * * * *